United States Patent [19]

Yamashita

[11] Patent Number: 4,675,616
[45] Date of Patent: Jun. 23, 1987

[54] SECOND ORDER ALL PASS NETWORK

[75] Inventor: Noriyuki Yamashita, Tokyo, Japan

[73] Assignee: Sony Corporation, Tokyo, Japan

[21] Appl. No.: 821,044

[22] Filed: Jan. 22, 1986

[30] Foreign Application Priority Data

Jan. 23, 1985 [JP] Japan .................................. 60-9266

[51] Int. Cl.$^4$ ............................ H03F 1/34; H03F 3/68
[52] U.S. Cl. ...................................... 330/84; 330/107;
330/260; 330/294; 330/306
[58] Field of Search ................. 330/84, 107, 109, 125,
330/260, 294, 302, 303, 306, 307

[56] References Cited

U.S. PATENT DOCUMENTS 3,689,752  9/1972  Gilbert ................................ 235/194
3,969,682  7/1976  Rossum .......................... 330/306 X

*Primary Examiner*—James B. Mullins
*Attorney, Agent, or Firm*—Hill, Van Santen, Steadman & Simpson

[57] ABSTRACT

A second order all pass network for wide-band signals, and comprising second and third voltage-current converting circuits with their respective positive input terminals supplied with input signals from an input terminal of the network and their negative input terminals supplied with output signals from an output terminal of the network. A first voltage-current converting circuit has its positive input terminal supplied with a positive output of the second voltage-current converting circuit and a negative input terminal supplied with the output signals. A first capacitor is connected between the input and output terminals, and a second capacitor is connected between ground and the positive output of the second voltage-current coverting circuit.

9 Claims, 4 Drawing Figures

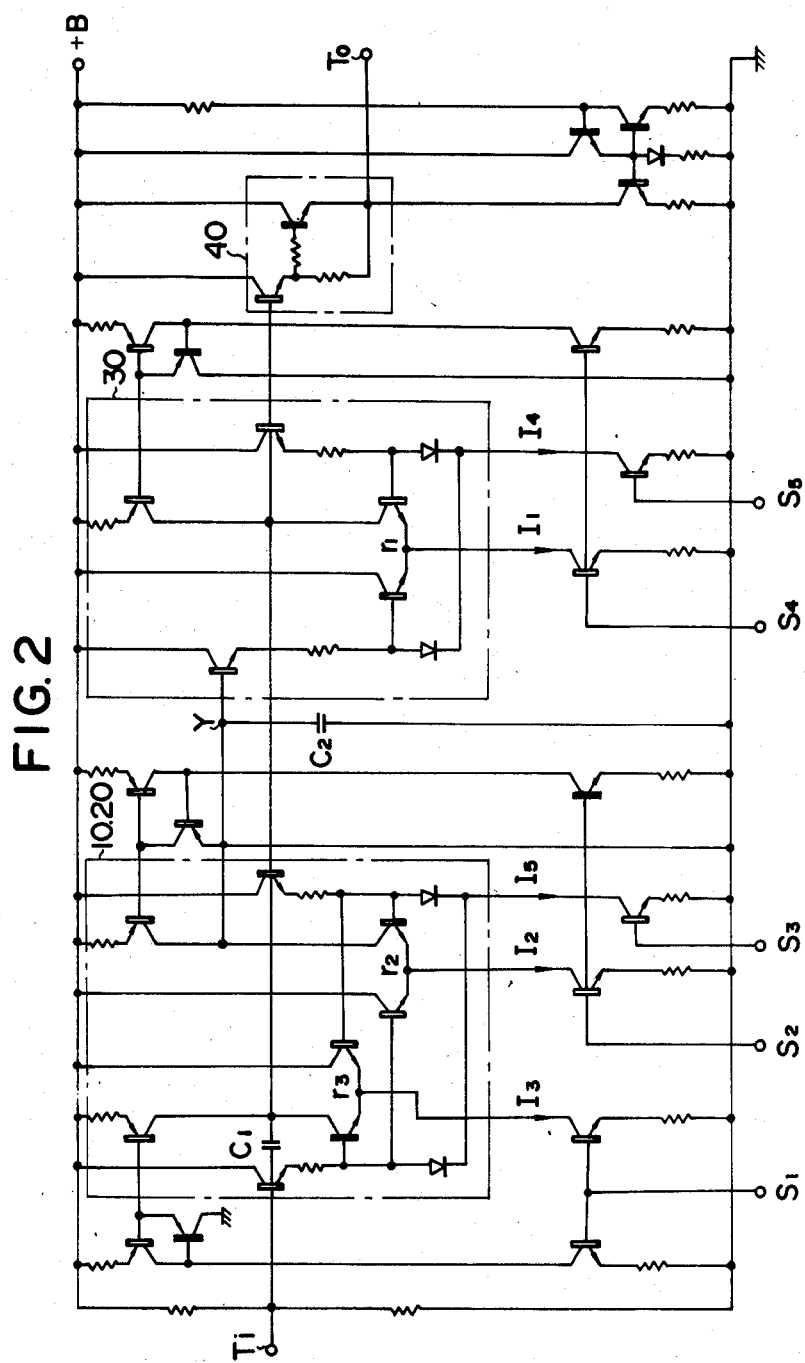

SECOND ORDER ALL PASS NETWORK

BACKGROUND OF THE INVENTION

The present invention relates to a second order all pass network for phase compensation of signals and more particularly to a second order active all pass network suited for integration thereof into an intergrated circuit (IC).

Video signals having a wide frequency range are signal-treated through a plurality of filter circuit stages so that desired frequency characteristics are provided therefor. In such cases, it sometimes becomes necessary to copensate for phase characteristics.

FIG. 3 is a block diagram showing an example of a prior art second order all pass network which has thus far been used for phase compensation.

Referring to the drawing, reference numerals 1 and 2 denote voltage-current converting circuits formed of differential amplifiers as the fundatmental component parts thereof and 3 denotes a buffer amplifier whose gain is unity.

In such a circuit, when mutual conductances $g_m$ of the first and second voltage-current converting circuits 1 and 2 are set at $1/r_2$ and $1/r_1$, respectively, and capacitances of the capacitors $C_1$ and $C_2$ are set at $c_1$ and $c_2$, respectively, a relationship between the signal $V_i$ at the input terminal $T_i$ and the signal $V_0$ at the output terminal $T_0$ is given by $$\begin{cases} \{(V_i - V_0)/r_2\}(1/j\omega c_2) = V_y & (1) \\ \{(V_y - V_0)/r_1 - (V_i - V_0)/r_2\}(1/j\omega c_1) = V_0 - V_i, & (2) \end{cases}$$

where $V_y$ is a potential at the point Y and $\omega$ is the angular frequency.

Eliminating $V_y$ from the above equations (1) and (2), we obtain $$V_0/V_i = \{(1 - j\omega c_2 r_1 + (j\omega)^2 c_1 r_1 c_2 r_2)\}/\{1 + j\omega c_2 (r_2 - r_1) + (j\omega)^2 c_1 r_1 c_2 r_2\}. \quad (3)$$

Making $r_2 = 2 r_1$ in the equation (3), we obtain $$V_0/V_i = \{1 - j\omega c_2 r_1 + (j\omega)^2 2 c_1 c_2 r_1^2\}/\{1 + j\omega c_2 r_1 + (j\omega)^2 2 c_1 c_2 r_1^2\} \quad (4)$$

Accordingly, $|V_0/V_i|$ becomes constant for any magnitude of the angular frequency $\omega$. That is, an all pass network in which a flat gain characteristic is maintained and only the phase is changed is obtained. The phase characteristic, as shown in FIG. 4, is that of a second order all pass network, in which there is no phase lag at $\omega = 0$ and a lag of 360° at $\omega = \infty$.

If now the values of the mutual conductance $(1/r_1)$ and the capacitances $c_1$ and $c_2$ of the capacitors are selected to satisfy $$\omega_c = (1/\sqrt{2 c_1 c_2}) 1/r_1$$

and $$Q = \sqrt{2 c_1/c_2},$$

then the above equation (4) is reduced to $$V_0/V_i = \{(1 - j\omega/\omega_c \cdot 1/Q + (j\omega/\omega_c)^2)\}/\{1 + j\omega/\omega_c \cdot 1/Q (j\omega/\omega_c)^2\}. \quad (5)$$

This equation shows that the phase rotation becomes 180° at $\omega = \omega_c$. The characteristic as shown in the dotted line in FIG. 4 is provided when the Q factor, which indicates the degree of the phase rotation, is high. The characteristic as shown in the one-dot chain line is provided when the Q factor is low.

In a demodulator circuit for a video signal or the like, a second order all pass network with a low Q factor of, for example, 0.5 or so is required for compensation of the group delay characteristic of a filter.

In the above described second order all pass network, if $c_1$ is equal to $c_2$, the Q factor becomes 1.414 because $$Q = \sqrt{2 c_1/c_2}.$$

To make $Q = 0.5$ or less, the ratio $c_2/c_1$ must be made 8, at the lowest. However, a capacitor provided in an IC structure in general can be provided to the highest accuracy only when its capacitance is 5 to 7 PF. If it is lower than this, the effect of the error due to stray capacity becomes larger. Also, it is difficult to provide a capacitor of larger capacitance in the IC structure. If it could be made, the chip size would become larger and impracticable.

Thus, the prior art second order all pass network has the problem that its Q factor is difficult to set at a desired value when it is integrated in an IC, and more particularly the second order all pass network has a low Q factor which could not be provided in an IC structure with accuracy.

SUMMARY OF THE INVENTION

The present invention solves these problems encountered in the prior art and has as its principal object to provide a second order all pass network wherein the capacitances of capacitors thereof can be provided at a proper value in an IC structure and whose Q factor can be selected at a desired value without difficulty.

To attain the above mentioned object, the second order all pass network of the present invention comprises first and second voltage-current converting circuits with a positive input terminal supplied with input signals from the input thereof and a negative input terminal supplied with output signals from the output thereof. A third voltage-current converting circuit with a positive input terminal is supplied with the positive output of the second voltage-current converting circuit and a negative input terminal is supplied with the output signals. A first capacitor is connected between the input and output, and a second capacitor is connected so as to ground therethrough the positive output of the second voltage-current converting circuit.

The value of mutual conductance (transconductance) of the second voltage-current converting circuit has no connection with the flat gain characteristic of the all pass network but has a connection with the Q factor. Therefore, the value of the Q factor of the all pass network can be set at any desired value by varying the mutual conductance by means of a bias current supplied externally, without varying capacitances of the capacitors.

BRIEF DESCRIPTION OF THE DRAWINGS

FIG. 2 illustrates an IC circuit diagram to which the block diagram of FIG. 1 corresponds;

DESCRIPTION OF THE PREFERRED EMBODIMENTS

Figure 1:
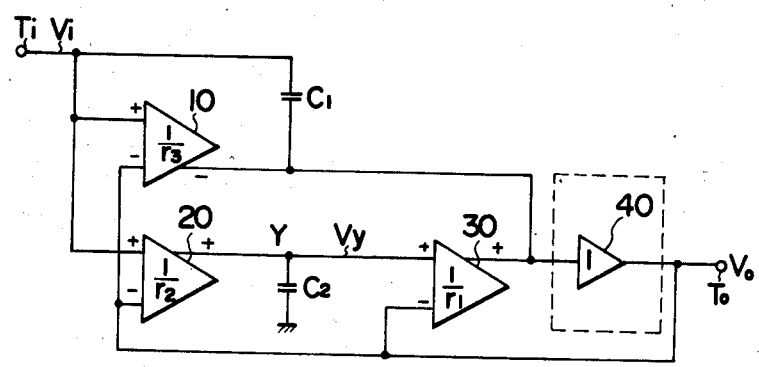
FIG. 1 is a block diagram showing a second order all pass network of an embodiment of the invention.
Figure 3:
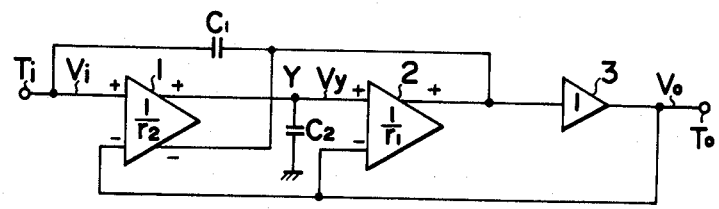
FIG. 3 is a block diagram showing a prior art second order all pass network.

FIG. 1 is a block diagram showing a second order all pass network of the invention in which reference numerals 10, 20, and 30 denote voltage-current converting networks whose mutual conductances gm are set at $1/r_3$, $1/r_2$, and $1/r_1$, respectively. Reference numeral 40 denotes a buffer amplifier whose gain is unity, and $C_1$ and $C_2$ denote capacitors for providing desired phase characteristics and Q factor. The buffer amplifier 40 can be omitted by properly arranging the structure of the voltage-current converting circuits.

Considering relationships among the input signal $V_i$, the output signal $V_0$, and the signal $V_y$ at the midpoint Y, we obtain the following relationships $$\begin{cases} \{(V_i - V_0)/r_2\} (1/j\omega c_2) = V_y & (6) \\ \{(V_y - V_0)/r_1 - (V_i - V_0)/r_3\} (1/j\omega c_1) = V_0 - V_i. & (7) \end{cases}$$

Readjusting the equations (6) and (7) to eliminate $V_y$, we obtain $$V_0/V_i = \{1 - j\omega c_2 r_2 r_1/r_3 + (j\omega)^2 c_1 r_1 c_2 r_2\}/\{1 + \quad (8)$$
$$j\omega c_2 r_2 (1 - r_1/r_3) + (j\omega)^2 c_1 r_1 c_2 r_2\}.$$

If here we make $r_1/R_3 = \frac{1}{2}$, then $$V_0/V_i = \{1 - (j\omega c_2 r_2)/2 + (j\omega)^2 c_1 r_1 c_2 r_2\}/\{1 + \quad (9)$$
$$(j\omega c_2 r_2)/2 + (j\omega)^2 c_1 r_1 c_2 r_2\}.$$

Thus, it has become possible to attain a second order all pass network which has the flat gain characteristic similar to the above described second order all pass network.

Figure 4:
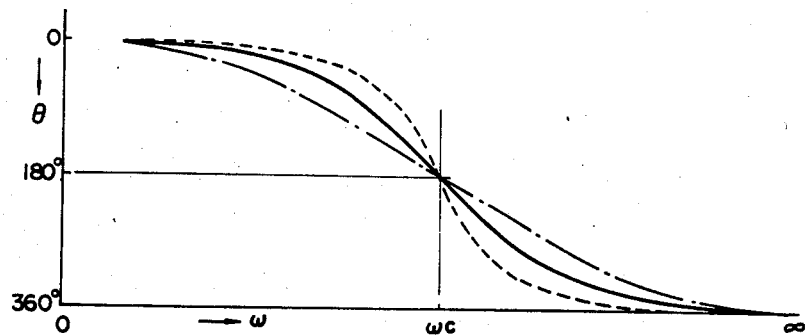
FIG. 4 illustrates phase characteristics in a second order all pass network.

And if now we make $$\omega_c = 1\sqrt{c_1 r_1 c_2 r_2} \quad (10)$$

and $$Q = 2\sqrt{(r_1 c_1)/(r_2 c_2)}, \quad (11)$$

the equation (9) can be expressed the same as the above described equation (5) and the phase characteristic of the second order all pass network as shown in FIG. 4 can be obtained.

In the second order all pass network of the invention, while the Q factor indicating the degree of phase rotation is given by the above equation (11), the condition for the flat gain characteristic is attained by making $r_3 = 2r_1$. Therefore, the value of $r_2$ can be freely selected with the condition that the flat gain characteristic is maintained unchanged.

Therefore, even under the condition that the ratio of $c_1$ to $c_2$ is 1:1, the all pass network whose value of Q factor is freely adjustable can be materialized by selecting the ratio of $r_2$ to $r_1$ at a proper value.

That is, if we make $r_2/r_1 = 16$ while maintaining $c_1 = c_2$, we can obtain Q=0.5, and so, a second order all pass network having a low Q factor under the condition that $c_1 = c_2$ is achieved.

Accordingly, when integrating the second order all pass newrork into an IC, the capacitances $c_1$ and $c_2$ of the capacitors $C_1$ and $C_2$ can be selected at around 5 to 7 PF at which the capacitors can be provided in an IC circuit with the highest accuracy, and based on this condition, an IC with an optional value of the Q factor, and specifically with a lower value of the Q factor, can be manufactured with accuracy.

FIG. 2 shows a circuit example of the second order all pass network showing an integrated circuit arrangement of the block diagram of FIG. 1. Portion 10, 20 surrounded by a one-dot chain line indicates the portion of the first and second voltage-current converting circuits. Portion 30 indicates the portion of the third voltage-current converting circuit, and portion 40 indicates the portion of the buffer amplifier circuit. The capacitors $C_1$ and $C_2$ are designed to be approximately 6 PF in capacitance.

All the voltage-current converting circuits 10, 20, and 30 are arranged in a modified Gilbert type multiplier structure, and the gm values $1/r_3$, $1/r_2$, and $1/r_1$ are adapted to be set according to the ratios between the currents $I_1$, $I_2$, and $I_3$ to be adjusted by external bias resistors, and the currents $I_4$ and $I_5$ to be controlled by internal bias resistors.

Accordingly, the second order all pass network having accurate phase characteristics can be provided by correcting errors in absolute resistance values of the resistors within the IC by means of the currents $I_1$, $I_2$, and $I_3$ which can be adjusted externally.

By the way, the terminals $S_1$, $S_2$, $S_3$, $S_4$, and $S_5$ in FIG. 2 are supplied with respective bias potentials as current sources. And, since the voltage-current converting circuits used in FIG. 2 have a higher impedance, the signal $V_0$ is fed back to the negative input terminals of the voltage-current converting circuits, and not by way of the buffer amplifier 40.

As described above, the second order all pass network according to the present invention is provided with the voltage-current converting circuits that have no connection with the flat gain characteristic, but do have a connection with the Q factor, and further, are arranged so that the Q factor of the second order all pass network can be readily set at a desired value. Consequently, a second order all pass network with a higher accuracy can be obtained, particularly when it is provided in an IC structure.

Although various minor changes and modifications might be proposed by those skilled in the art, it will be understood that I wish to include within the claims of the patent warranted hereon all such changes and modifications as reasonably come within my contribution to the art.

I claim as my invention:

1. A second order all pass network for wide-band signals, comprising:
    an input terminal at which input signals are received;

first, second, and third voltage-current converting circuits each having first and second opposite polarity inputs and each having an output;

the first and second converting circuit first inputs connecting to said input terminal;

an output terminal at which output signals are delivered;

the output of said first voltage-current converting circuit and the output of said third voltage-current converting circuit being connected to said output terminal;

a feedback loop connected between said output terminal and the second inputs of said first, second, and third voltage-current converting circuits;

a first capacitor connected between said input terminal and said output of said first voltage-current converting circuit; and the output of said second voltage-current converting circuit connecting to said first input of said third voltage-current converting circuit and also to a second capacitor connected to a reference potential.

2. A second order all pass network according to claim 1 wherein said first inputs of said first, second, and third voltage-current converting circuits are positive inputs and said inputs are negative inputs.

3. A second order all pass network according to claim 2 wherein said output of said first voltage-current converting circuit is a negative output and said outputs of said second and third voltage-current converting circuits are positive outputs.

4. A second order all pass network according to claim 3 wherein said first and third voltage-current converting circuits have respective mutual conductances of $r_1$ and $r_3$, and wherein $r_1/r_3$ is selected to be substantially $\frac{1}{2}$.

5. A second order all pass network according to claim 4 wherein said first capacitor and second capacitor are selected to be substantially equal in capacitance.

6. A second order all pass network according to claim 5 wherein said mutual conductances of said first and third voltage-current converting circuits and a mutual conductance of said second voltage-current converting circuit are controlled by adjusting d.c. bias potentials supplied to their biasing circuits.

7. A second order all pass network for wide-band signals, comprising:

an input terminal at which input signals are received;

first, second, and third voltage-converting circuits each having positive and negative inputs, the third converting circuit having a negative output and the first and second converting circuits having positive outputs;

an output terminal at which output signals are delivered;

the negative output of the third converting circuit and the positive output of the first converting circuit being connected to the output terminal;

the negative inputs of the first, second, and third converting circuits connecting to the output terminal;

the positive inputs of the second and third converting circuits connecting to said input terminal;

a first capacitor connected between the input terminal and the negative output of the third converting circuit; and the positive output of the second converting circuit connecting to the positive input of the first converting circuit and also to a second capacitor connected to a potential.

8. A network according to claim 7 wherein the first and second capacitors have approximately a same capacitance.

9. A network according to claim 7 wherein the network is an integrated circuit together with the first and second capacitors.

* * * * *